United States Patent
Gruber et al.

(10) Patent No.: US 10,658,267 B2
(45) Date of Patent: May 19, 2020

(54) METAL CORED SOLDER DECAL STRUCTURE AND PROCESS

(71) Applicant: International Business Machines Corporation, Armonk, NY (US)

(72) Inventors: Peter A. Gruber, Mohegan Lake, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/896,480

(22) Filed: Feb. 14, 2018

(65) Prior Publication Data
US 2018/0174949 A1  Jun. 21, 2018

Related U.S. Application Data

(62) Division of application No. 14/797,815, filed on Jul. 13, 2015, now Pat. No. 9,972,556, which is a division
(Continued)

(51) Int. Cl.
*H01L 21/44* (2006.01)
*H01L 23/48* (2006.01)
(Continued)

(52) U.S. Cl.
CPC ............ *H01L 23/48* (2013.01); *B23K 1/0016* (2013.01); *B23K 3/0607* (2013.01);
(Continued)

(58) Field of Classification Search
None
See application file for complete search history.

(56) References Cited

U.S. PATENT DOCUMENTS

| 5,244,143 A | 9/1993 | Ference et al. |
| 5,673,846 A | 10/1997 | Gruber |

(Continued)

OTHER PUBLICATIONS

Nah, et al., "C4NP (C4 New Process) copper cored flip chip interconnections", ECTC 2008, The 58th Electronic Components and Technology Conference, May 27-20, 2008, pp. 1-20.
(Continued)

*Primary Examiner* — Daniel Whalen
(74) *Attorney, Agent, or Firm* — Scully, Scott, Murphy & Presser, P.C.; Daniel Morris, Esq.

(57) ABSTRACT

A system of producing metal cored solder structures on a substrate includes: a decal, a carrier, and receiving elements. The decal includes one or more apertures each of which is tapered from a top surface to a bottom surface thereof. The carrier is positioned beneath the bottom of the decal and includes cavities in a top surface. The cavities are located in alignment with the apertures of the decal. The decal is positioned on the carrier having the decal bottom surface in contact with the carrier top surface to form feature cavities defined by the decal apertures and the carrier cavities. The feature cavities are shaped to receive one or more metal elements and are configured for receiving molten solder cooled in the cavities. The decal is separable from the carrier to partially expose metal core solder contacts. The receiving elements receive the metal core solder contacts thereon.

3 Claims, 10 Drawing Sheets

Related U.S. Application Data of application No. 13/565,982, filed on Aug. 3, 2012, now Pat. No. 9,082,754.

(51) Int. Cl.

| | | |
|---|---|---|
| *H01L 23/00* | (2006.01) | |
| *B23K 3/06* | (2006.01) | |
| *B23K 1/00* | (2006.01) | |
| *B23K 26/384* | (2014.01) | |
| *B23K 26/40* | (2014.01) | |
| *B23K 26/382* | (2014.01) | |
| *B23K 101/42* | (2006.01) | |
| *B23K 103/16* | (2006.01) | |
| *H01L 23/498* | (2006.01) | |
| *H01L 21/48* | (2006.01) | |
| *H01L 23/14* | (2006.01) | |

(52) U.S. Cl.
CPC .......... *B23K 3/0623* (2013.01); *B23K 26/384* (2015.10); *B23K 26/389* (2015.10); *B23K 26/40* (2013.01); *H01L 24/11* (2013.01); *H01L 24/13* (2013.01); *H01L 24/14* (2013.01); *B23K 2101/42* (2018.08); *B23K 2103/16* (2018.08); *H01L 21/4853* (2013.01); *H01L 23/14* (2013.01); *H01L 23/147* (2013.01); *H01L 23/49816* (2013.01); *H01L 24/03* (2013.01); *H01L 24/05* (2013.01); *H01L 2224/0345* (2013.01); *H01L 2224/0347* (2013.01); *H01L 2224/03464* (2013.01); *H01L 2224/0401* (2013.01); *H01L 2224/056* (2013.01); *H01L 2224/111* (2013.01); *H01L 2224/11003* (2013.01); *H01L 2224/11005* (2013.01); *H01L 2224/1112* (2013.01); *H01L 2224/11436* (2013.01); *H01L 2224/11472* (2013.01); *H01L 2224/11849* (2013.01); *H01L 2224/136* (2013.01); *H01L 2224/13017* (2013.01); *H01L 2224/13144* (2013.01); *H01L 2224/13147* (2013.01); *H01L 2224/13155* (2013.01); *H01L 2224/13551* (2013.01); *H01L 2224/13561* (2013.01); *H01L 2224/81101* (2013.01); *H01L 2224/81191* (2013.01); *H01L 2924/01322* (2013.01); *H01L 2924/12042* (2013.01)

(56) References Cited

U.S. PATENT DOCUMENTS

| | | |
|---|---|---|
| 7,780,063 B2 | 8/2010 | Budd et al. |
| 7,786,001 B2 | 8/2010 | Buchwalter et al. |
| 7,906,420 B2 | 3/2011 | Gruber et al. |
| 7,928,585 B2 | 4/2011 | Buchwalter et al. |
| 8,053,283 B2 | 11/2011 | Gruber et al. |
| 8,138,020 B2 | 3/2012 | Gruber et al. |
| 2005/0006759 A1 | 1/2005 | Huang |
| 2008/0251281 A1 | 10/2008 | Buchwalter et al. |
| 2009/0093111 A1 | 4/2009 | Buchwalter et al. |
| 2010/0072263 A1 | 3/2010 | Gruber et al. |
| 2010/0230143 A1 | 9/2010 | Buchwalter et al. |
| 2010/0230474 A1 | 9/2010 | Buchwalter et al. |
| 2010/0230475 A1 | 9/2010 | Buchwalter et al. |
| 2010/0270067 A1 | 10/2010 | Choi et al. |
| 2011/0097892 A1 | 4/2011 | Buchwalter et al. |
| 2011/0272450 A1 | 11/2011 | Gruber |
| 2012/0042515 A1 | 2/2012 | Shoji et al. |
| 2014/0004697 A1* | 1/2014 | Shen .................. H01L 21/4853 438/614 |

OTHER PUBLICATIONS

List of IBM Patents or Patent Applications Treated as Related, dated Feb. 14, 2018, 2 pages.

* cited by examiner

METAL CORED SOLDER DECAL STRUCTURE AND PROCESS

CROSS REFERENCE TO RELATED APPLICATIONS

This application is a divisional application of U.S. patent application Ser. No. 14/797,815, which is a divisional application of U.S. patent application Ser. No. 13/565,982. This application is related to the following commonly-owned, United States Patents, and United States Patent applications, the entire contents and disclosures of which are expressly incorporated by reference herein in their entirety: U.S. patent application Ser. No. 12/121,236, now U.S. Pat. No. 7,780,063, "TECHNIQUES FOR ARRANGING SOLDER BALLS AND FORMING BUMPS"; and U.S. patent application Ser. No. 11/869,573, now U.S. Pat. No. 7,928,585, "SPROCKET OPENING ALIGNMENT PROCESS AND APPARATUS FOR MULTILAYER SOLDER DECAL"; U.S. patent application Ser. No. 12/983,292.

BACKGROUND OF THE INVENTION

1. Field of the Invention

The present invention related to a method and system for producing metal cored solder structures; and the present invention also relates to a metal cored solder decal structure for utilization in manufacturing semiconductor or flip chip interconnections.

2. Discussion of the Prior Art

The present state of the art is directed to increasing the Cu/Sn ratio in flip chip semiconductor interconnections in order to be able to exploit the benefits of the copper (Cu) content that is contained therein. Copper possess a high thermal conductivity of about 398 W/m·K and a low electrical resistivity of about 1.69 mΩ·cm. In comparison, pure Sn has a thermal conductivity of about 67 W/m·K and an electrical resistivity of about 11.4 mΩ·cm, whereas eutectic PbSn solder has a thermal conductivity of about 51 W/m·K and an electrical resistivity of about 17.0 mΩ·cm. In the current state-of-the-art, there have been integrated Cu die-side bumps by using a Cu electroplating process in high-volume manufacturing quantities and with disclosed inherent reliability benefits that are related to stress, electromigration and thermal conductivity. Furthermore, it has been ascertained in the technology that the etched Cu post substrate technology can, potentially, reduce the actually expected thermal resistance of the semiconductor or flip chip interconnections.

Moreover, there is also described in Ference, et al., U.S. Pat. No. 5,244,143, that the C4 NP (controlled collapse chip connect new process) can be readily extended so as to be capable of providing high Cu/Sn ratio chip interconnections through the insertion of copper (Cu) spheres into the center of flip chip joints. U.S. Pat. No. 5,244,143 is commonly assigned to the present assignee, and the disclosure of which is incorporated herein by reference in its entirety. The foregoing concept is currently utilized as described in commonly assigned U.S. patent application Ser. No. 11/733,840, now U.S. Pat. No. 7,786,001, the disclosure of which is incorporated herein by reference in its entirety. In that instance, the application provides for an area array composite interconnect structure that is constituted of a copper core which is connected to respective bond pads on a semiconductor device, and a packaging substrate with a solder. However, pursuant to the foregoing co-pending patent application, a process of transferring is described as being implemented in two steps in a separate manner with the utilization of the solder and copper.

Moreover, pursuant to copending U.S. Ser. No. 11/733,840, the foregoing is limited to producing Cu cored solder bumps only on the surface of Si (silicon) wafer, whereas contrastingly in the technology there is currently a considerable need to provide for the formation of metal cored solder bumps on a substrate surface, inasmuch as the copper post that is prevalent on the substrate surface reduces the thermal resistance of the electrical interconnection.

In addition to the foregoing, other aspects known in the art are disclosed in Buchwalter et. Al., U.S. Patent Publication Nos. 2009/0093111 and 2008/0251281; Gruber, U.S. Pat. No. 5,673,846, and Ference, U.S. Pat. No. 5,244,143; all of which are commonly assigned to the present assignee, and the disclosures of which are incorporated herein by reference in their entireties.

Flip-chip joints are shown in U.S. Pat. No. 7,786,001, commonly assigned to the present assignee, and which disclosure is expressly incorporated by reference herein in its entirety. U.S. Pat. No. 7,786,001 discloses an area array composite interconnect structure made up of a copper core connected to respective bond pads on a semiconductor device and a packaging substrate with solder. However, the method includes two steps of transfer processes of solder and Cu, separately. Also, U.S. Pat. No. 7,786,001 is limited to making Cu cored solder bumps only on the Si wafer side.

The known art uses a process utilizing copper Si die bumps by employing a copper electroplating process, and entails the need for an extremely expensive procedure, inasmuch as it necessitates the application of a lithographic process of thick photoresists, whereas other prior art publications disclose the use of copper post bumps on the side of the substrate, and which also require the implementing of lithographic processes for the etching of a copper layer.

SUMMARY OF THE INVENTION

There exists a need in the art to form metal cored solder bumps on the substrate side because the Cu post on the substrate side reduces the interconnection thermal resistance. Further, it would be desirable to form metal cored solder bump structures utilizing a simple one step transfer process.

Accordingly, in order to improve upon and uniquely evidence the current state of the technology, the invention provides for a novel metal cored solder bump fabrication method that is implemented on Si wafers and/or electronic package substrates. A basic concept of the present invention uses the combination of a polymer film and a Si fixture in order to form metal cored solder bumps through the intermediary of only a single step transfer process. The polymer film which has through-holes found therein, aids in the arrangement of metal balls in the Si mold plate and in the implementation of a solder filled IMS (injection molded solder) process in a simultaneous manner. Moreover, the polymer film renders it possible to form metal cored solder bumps on the surface of the substrate because of a close CTE (coefficient of thermal expansion) match with that of the substrate.

Hereby, in contrast with known techniques, the present invention is directed to providing for an increase in the Cu/Sn ratio of a solder bump in the absence of requiring the application of a lithography process. Moreover, in further improving the prior art and the state of the current technology, the present invention requires only a single step transfer process, and can be applied in order to form the metal cored bumps on the substrate surface.

It is, accordingly, an object of the present invention to provide a system for producing metal cored solder structures on a substrate includes: a decal having a plurality of apertures, the apertures being tapered from a top surface to a bottom surface of the decal; a carrier configured for positioning beneath the bottom of the decal, the carrier having cavities in a top surface and the cavities located in alignment with the apertures of the decal; the decal being configured for positioning on the carrier having the decal bottom surface in contact with the carrier top surface to form feature cavities defined by the decal apertures and the carrier cavities, the feature cavities being shaped to receive a plurality of metal elements therein, the feature cavities configured for receiving molten solder being cooled in the cavities, the decal being separable from the carrier to partially expose metal core solder contacts; and receiving elements of a substrate being configured to receive the metal core solder contacts thereon, and the metal core solder contacts being exposed and positioned on the substrate.

In another aspect of the invention, a method of producing metal cored solder structures on a substrate includes: providing a decal having a plurality of apertures, the apertures being tapered from a top surface to a bottom surface of the decal; positioning the decal on a substrate, the substrate having solder wetting pads in a top surface and the pads located in alignment with the apertures of the decal; positioning the decal on the substrate having the decal bottom surface in contact with the substrate top surface to; positioning a plurality of metal elements in the feature apertures of the decal; filling the feature apertures with molten solder and cooling the solder; and removing the decal.

In another aspect of the invention, a method of producing metal cored solder structures on a substrate includes: providing a dry film on a substrate, the substrate having solder wetting pads; patterning the dry film and forming a plurality of apertures on the wetting pads; positioning a plurality of metal elements in the feature apertures of the dry film; filling the feature apertures with molten solder and cooling the solder; and removing the dry film.

BRIEF DESCRIPTION OF THE DRAWINGS

The features and advantages of the present disclosure will become apparent from the following detailed description of illustrative embodiments thereof, which is to be read in connection with the accompanying drawings. The various features of the drawings are not to scale as the illustrations are for clarity in facilitating one skilled in the art in understanding the disclosure in conjunction with the detailed description. In the drawings.

DETAILED DESCRIPTION OF THE INVENTION

Figure 1A:
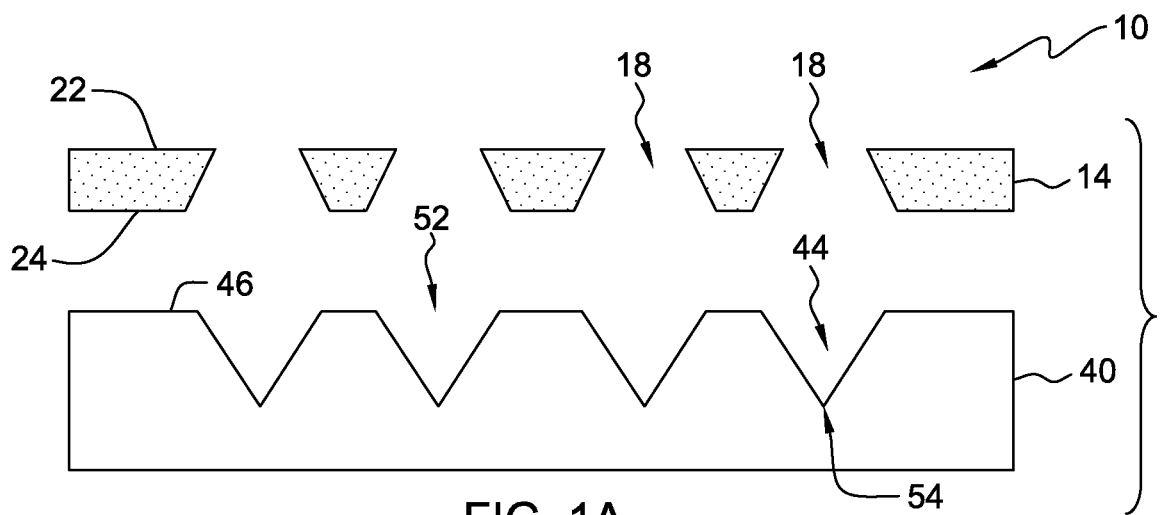
FIGS. 1A through 1F is a sequence of schematic block diagrams illustrating sequentially a method for a single-step transfer in forming metal cored solder bumps on Si wafers or organic substrates according to an embodiment of the invention.

The present disclosure will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring to FIGS. 1A-1F and 2A-2C, according to an illustrative embodiment of the present disclosure, a method 10 and system for processing metal cored solder contacts (bumps or structures) on an Si wafer includes providing a decal 14 having apertures 18 or holes therethrough. The apertures 18 are tapered from a top surface 22 of the decal 14, to a bottom surface 24 of the decal 14 which define the apertures 18. In the embodiment of the invention shown in FIGS. 1A and 1B, the decal 14 has a narrower top portion 26 of each of the apertures 18, and a wider bottom portion 28 of each of the apertures 18, as defined by the geometry of the decal 14, and shown in FIG. 1B.

Figure 1B:
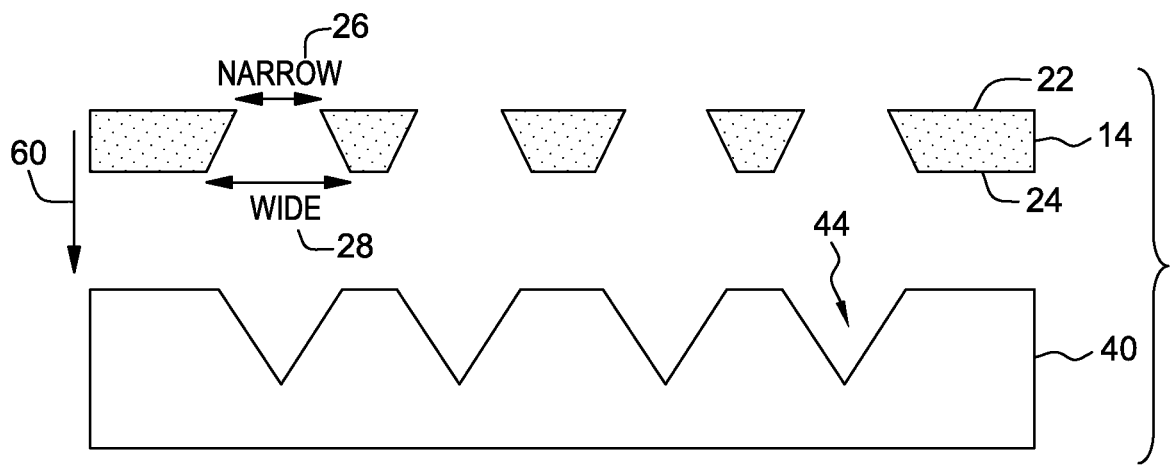

A carrier embodied as a Silicon (Si) fixture or silicon carrier 40 includes cavities 44. The carrier 40 has a top surface 46. The cavities 44 have a wider top portion 52 and a bottom point 54 thereby being generally "V" shaped forming cavities 44, as shown in FIGS. 1A and 1B. The cavities 44 may be, for example, V, U, or pyramidal shaped.

Figure 1C:
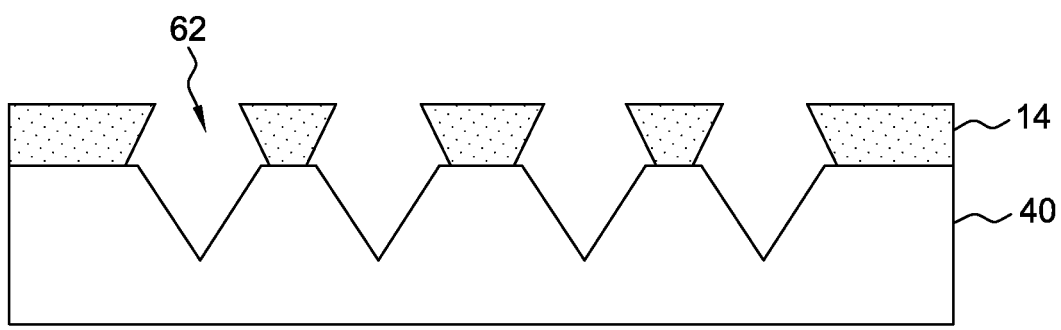

The decal 14 is moved toward the carrier 40 in direction 60 as shown in FIG. 1B, and positioned on the carrier 40 as shown in FIG. 1C to form feature cavities 62. The feature cavities 62 are defined by the decal apertures 18 and the carrier cavities 44 of the decal 14 and the carrier 40, respectively.

Figure 1D:
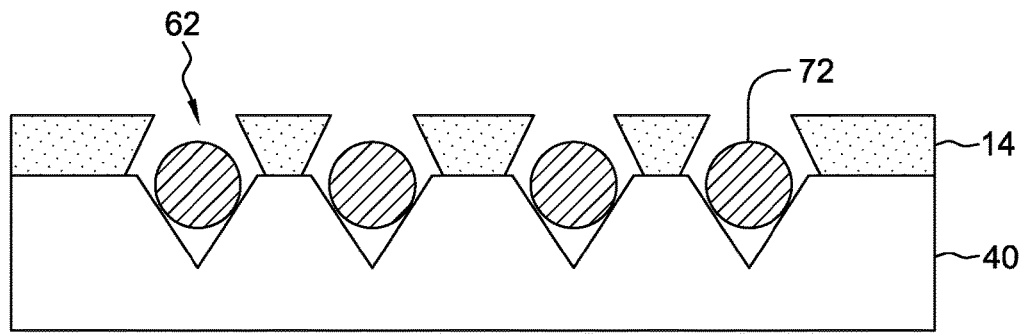
Figure 1E:
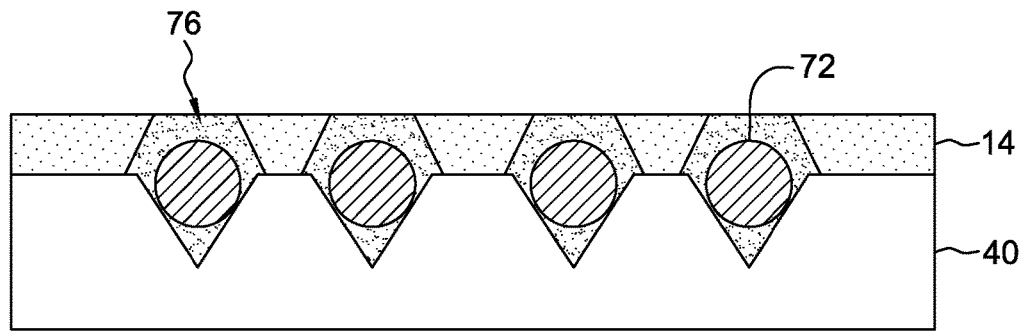
Figure 1F:
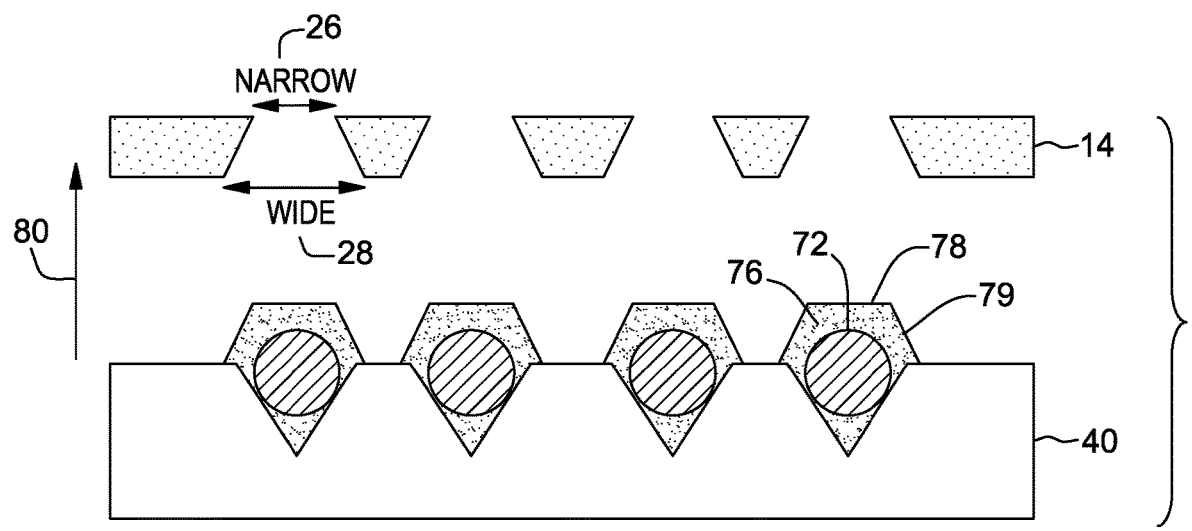

Referring to FIG. 1D, a metal element embodied as a metal ball 72 is positioned in the feature cavities 62. The metal ball 72 may be comprised of, for example, Cu (copper), Au (Gold), or Ni (Nickel). The feature cavity is filled with molten solder 76 as shown in FIG. 1E. The solder may be injection molded. The molten solder 76 is cooled. The decal 14 is moved away from the carrier 40 in the direction 80 as shown in FIG. 1F. Metal core solder contacts 78 are comprised of the solder 76 surrounding the metal ball 72. The metal core solder contacts 78 are partially exposed when the decal 14 is removed, specifically, a top portion 79 of the metal core solder contacts 78 are exposed.

Figure 2A:
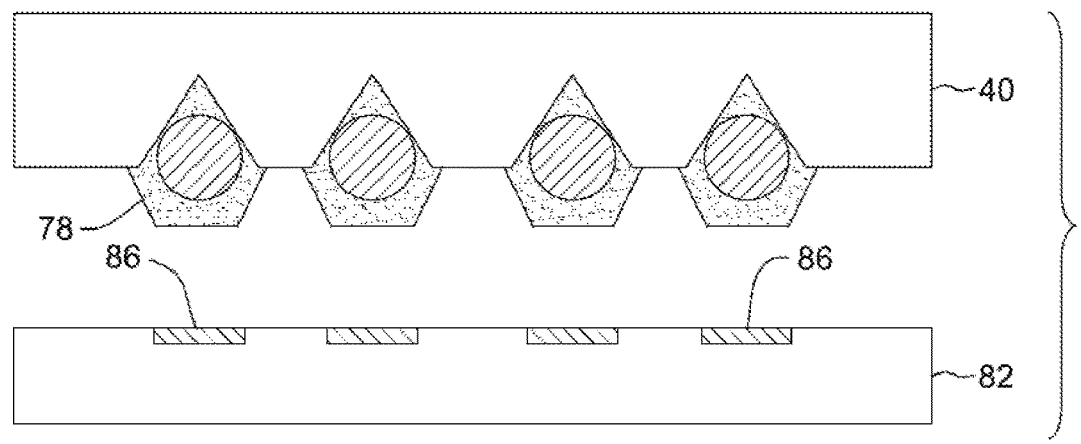
FIGS. 2A through 2C is a sequential block diagram illustrating a sequence representing a silicon mold transfer to a semiconductor wafer.
Figure 2B:
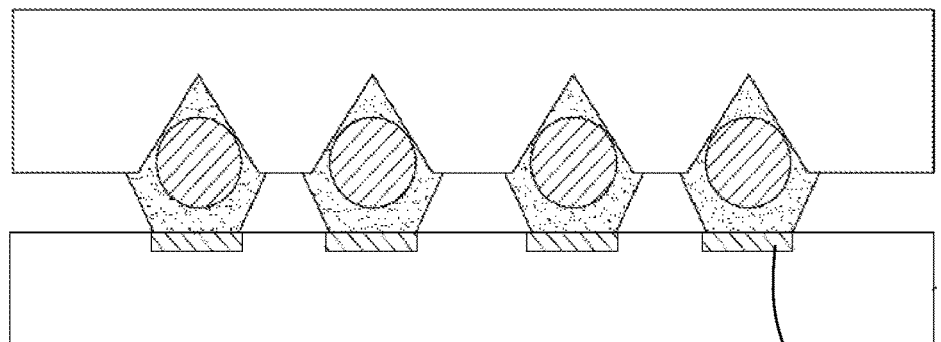

Referring to FIG. 2A, the metal core solder contacts 78 are positioned on receiving elements 86 of a substrate, which may be embodied as a silicon wafer 82. The carrier 40 is flipped over to be positioned over the wafer 82 as shown in FIG. 2A. The metal core solder contacts 78 are aligned with the receiving element 86. The receiving elements 86 can include Ball Limiting Metallurgy (BLM), positioned in the wafer 82 for receiving the metal core solder contacts 78, as shown in FIG. 2B. Ball-limiting metallurgy (BLM) is also known as under bump metallization (UBM) and involves the evaporation onto a wafer surface of solder through mask openings, the electroplating, or sputtering in an area array fashion. The combined carrier 40 and wafer 82, as shown in FIG. 2B is heated, thereby reflowing the solder 76 of the solder contacts 78, to arrive at the generally spherical shaped metal core solder contacts 78 shown in FIG. 2C.

Figure 2C:
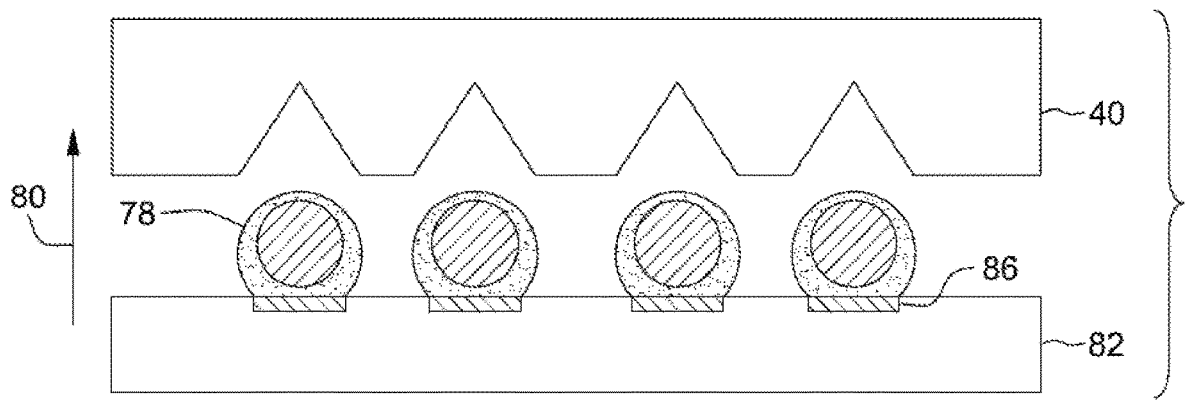

Referring to FIG. 2C, the carrier 40 is removed, in direction 80, after heating as above, from contact with the metal core solder contacts 78 to expose the metal core solder contacts 78 on the wafer 82.

Figure 3A:
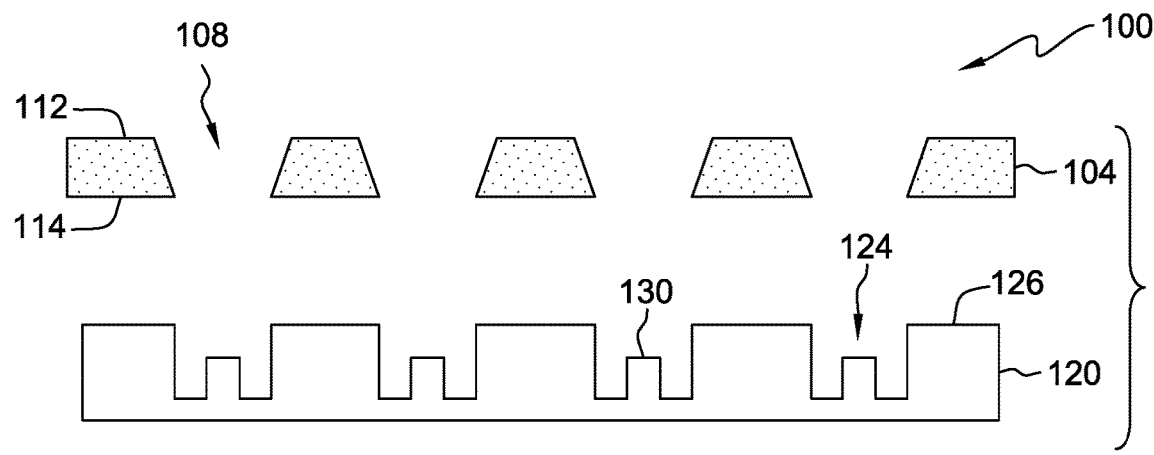
FIGS. 3A through 3F are sequential schematic block diagrams illustrating a metal cored solder decal transfer to a decal mold according to an embodiment of the invention.
Figure 3B:
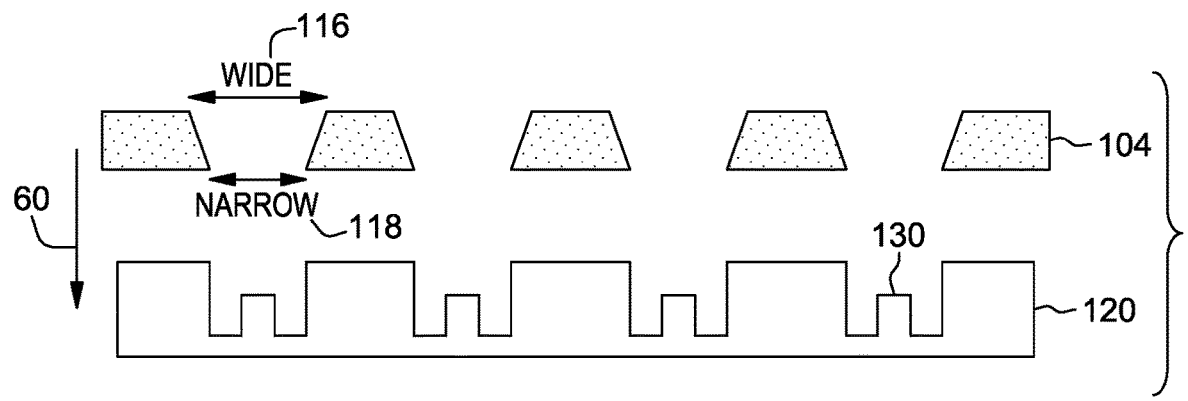
Figure 3C:
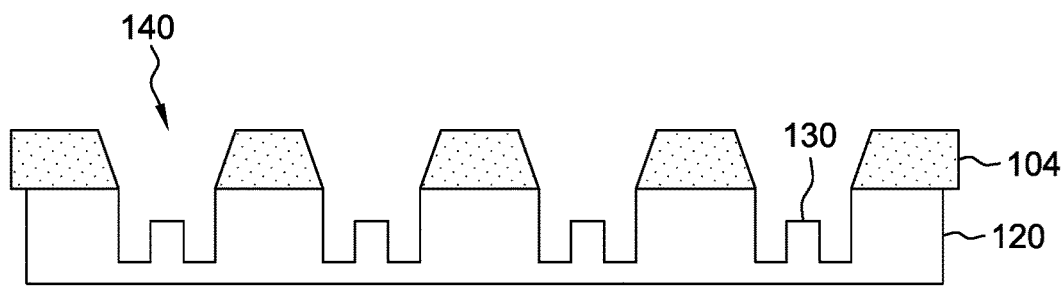

Referring to FIGS. 3A-3C, a method 100 and system according to another embodiment of the present invention for processing metal cored solder contacts includes a decal 104 having apertures 108 or holes therethrough. The apertures 108 are tapered from a top surface 112 of the decal 104 to a bottom surface 114 of the decal 104. In the embodiment of the invention shown in FIGS. 3A and 3B, the decal 104 has a narrower top portion 116 of each of the apertures 108, and a wider bottom portion 118 of each of the apertures 108, as defined by the geometry of the decal 104.

In FIG. 3A, a carrier embodied as a Silicon (Si) fixture or silicon carrier 120 includes cavities 124. The carrier 120 has a top surface 126. The cavities 124 have a generally rectangular geometry with a top opening 126, and an upwardly extending element 130 is positioned on a bottom surface 128 of the cavities 124, as shown in FIGS. 3A and 3B.

The decal 104 is moved toward the carrier 120 in direction 60 as shown in FIG. 3B, and positioned on the carrier 120 as shown in FIG. 3C to form feature cavities 140. The feature cavities 140 are defined by the decal apertures 108 and the carrier cavities 124 of the decal 104 and the carrier 120, respectively.

Figure 3D:
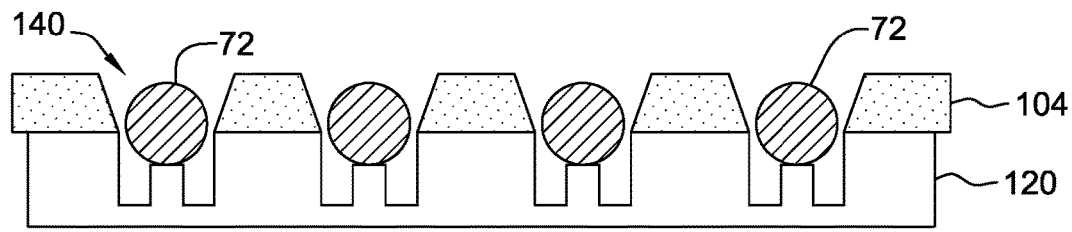
Figure 3E:
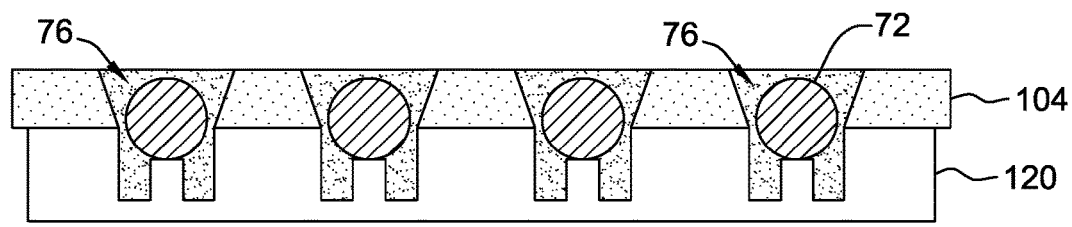
Figure 3F:
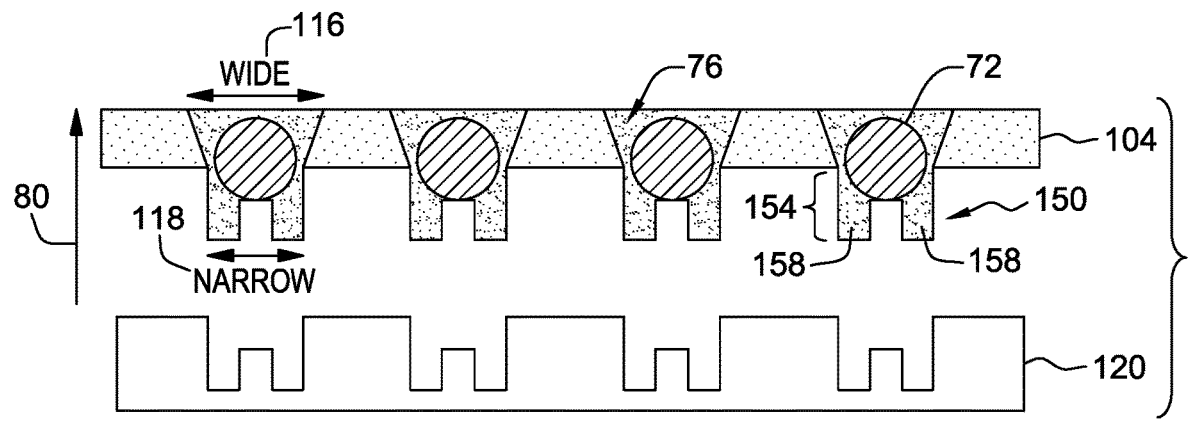

Referring to FIG. 3D, a metal element embodied as a metal ball 72 is positioned in the feature cavities 140. The feature cavity 140 is filled with molten solder 76 as shown in FIG. 3E. The solder may be injection molded. The molten solder 76 is cooled. The decal 104 is moved away from the carrier 120 in the direction 80 as shown in FIG. 3F. Metal core solder contacts 150 are comprised of the solder 76 surrounding the metal ball 72, which is held in the decal 104. The metal core solder contacts 150 are partially exposed when the decal 104 is removed, specifically, a bottom portion 154 of the metal core solder contacts 150 are exposed, and have two legs 158. The narrow opening side 118 of the aperture 108 of the decal 104, as opposed to the wide side 116 of the aperture 108, holds the solder contact 150 during the separation of the decal 104 from the carrier 120.

Figure 4A:
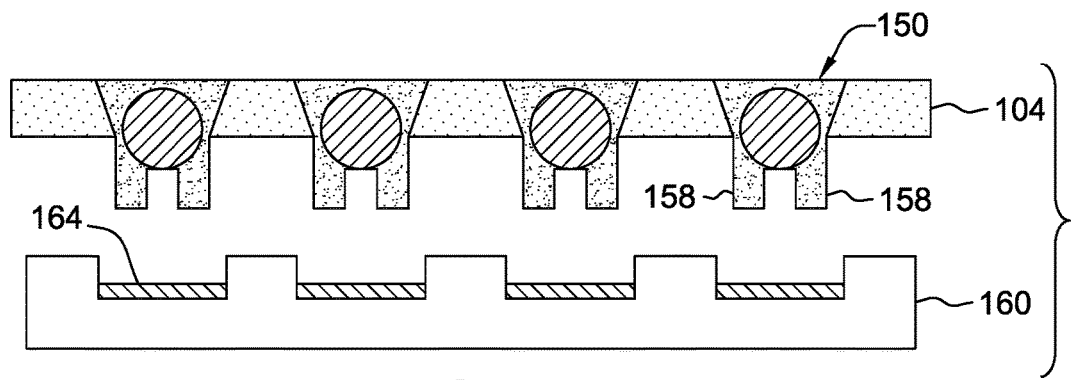
FIGS. 4A through 4C are sequential schematic block diagrams illustrating a decal mold transfer to an organic substrate from FIGS. 3A-3F.
Figure 4B:
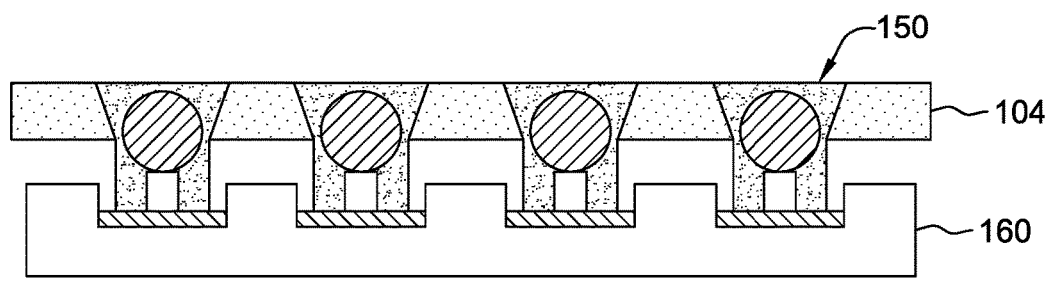

Referring to FIG. 4A, the metal core solder contacts 150 are positioned on receiving elements 164 of a substrate, which may be embodied as an organic substrate 160. The decal 104 is positioned over the organic substrate 160 as shown in FIG. 4A. The metal core solder contacts 150 are aligned with the receiving element 164. The receiving elements 164 may include a specified metallurgy for receiving the metal core solder contacts 150, as shown in FIG. 4B. The combined decal 104 and organic substrate 160, as shown in FIG. 4B is heated, thereby reflowing the solder 76 of the solder contacts 150, to arrive at the generally spherical shaped metal core solder contacts 152 shown in FIG. 4C.

Figure 4C:
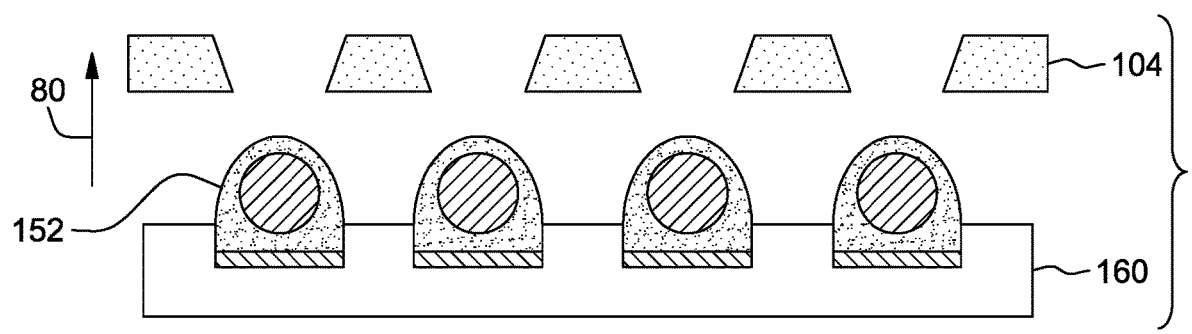

Referring to FIG. 4C, the decal 104 is removed, in direction 80, after heating as above, from holding the metal core solder contacts 152 which exposes the metal core solder contacts 152 on the organic substrate 160.

Figure 5A:
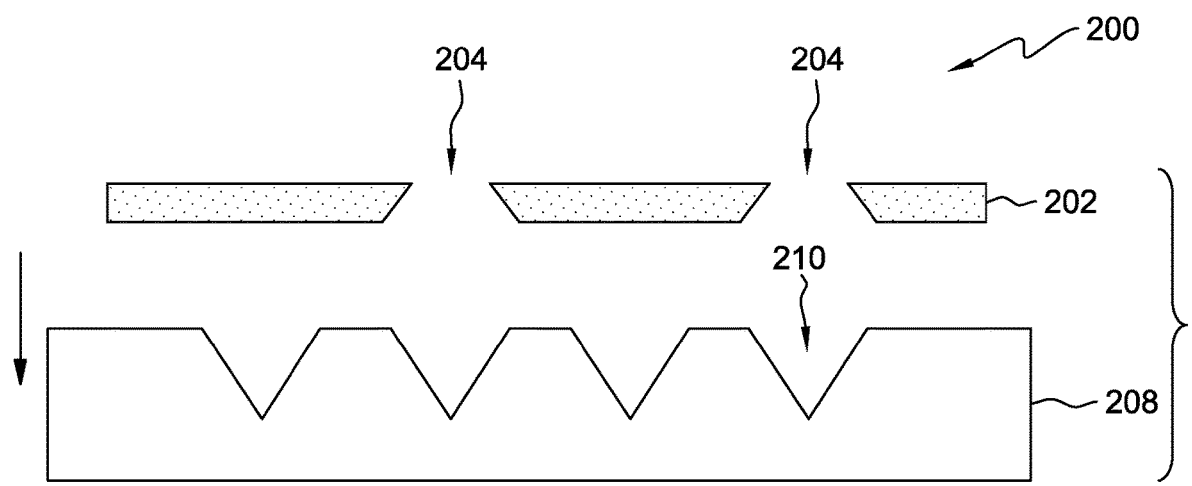
FIGS. 5A-5C are sequential block diagrams of a process for forming metal contacts using a mask and a mold for selectively inserting metal spheres according to an embodiment of the invention.
Figure 5B:
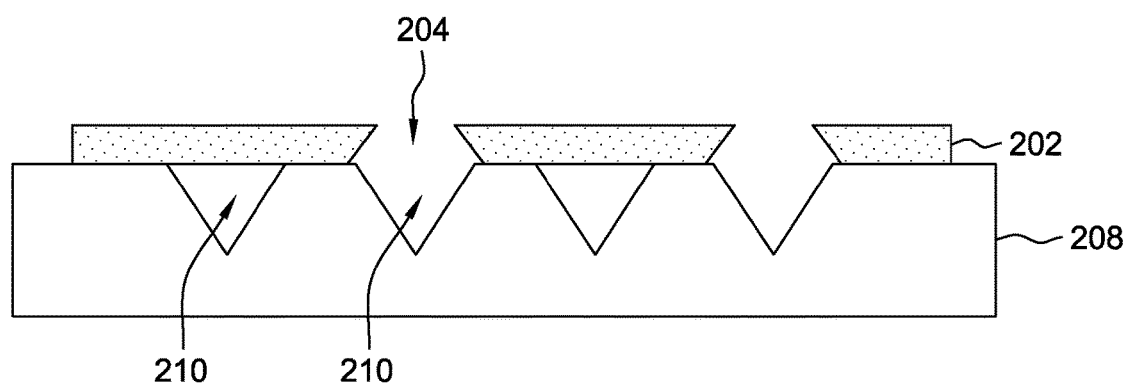
Figure 5C:
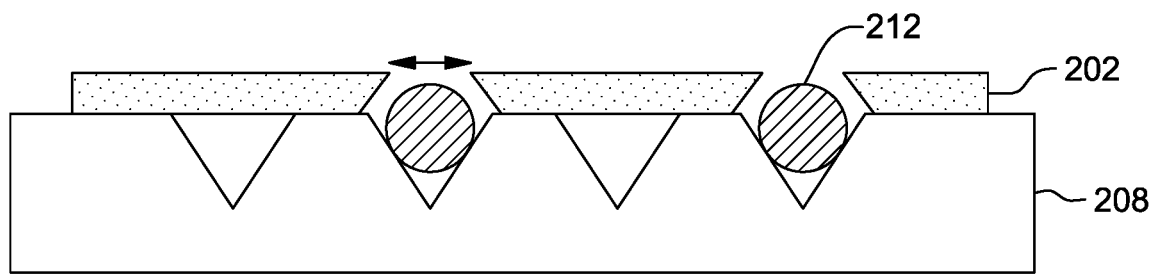
Figure 6:
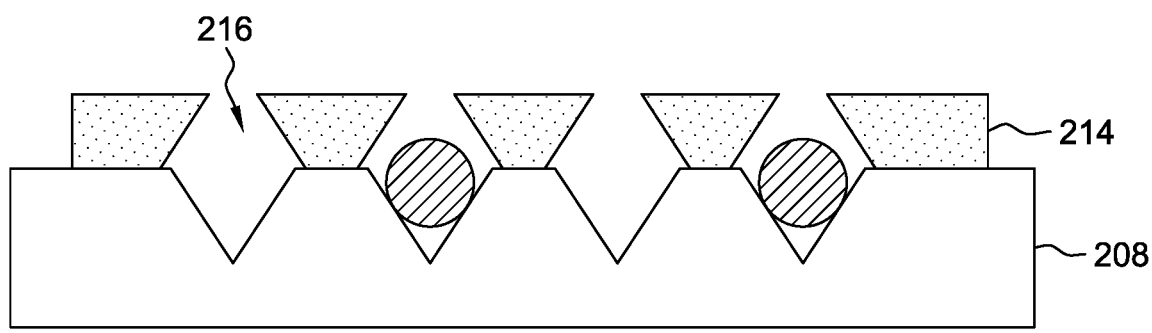
FIG. 6 is a block diagram of the process shown in FIGS. 5A-5C showing a second mask.
Figure 7:
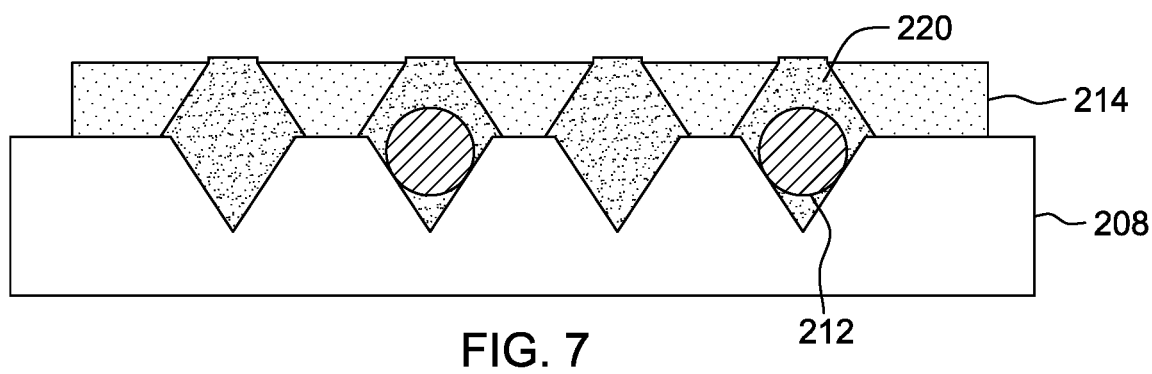
FIG. 7 is a block diagram showing injection molding of the mask and mold shown in FIG. 6.

Referring to FIGS. 5A-7, a method 200 and system according to another embodiment of the present invention for processing solder contacts includes a mask and a mold for selectively forming metal spheres. In FIG. 5A, a film 202 includes holes 204 positioned over "V" shaped recesses 210 in a mold 208. Other shapes may be used, for example, a "U" shape. The film 202 may be a polymer film, and the mold may be a comprised of, for example, silicon, glass, or ceramic. As shown in FIG. 5B, the recesses 210 may be selectively covered by the film applied to the mold 208, such that access to the recess 210 is denied. Other recesses 210 are available by being aligned with the holes 204 in the film 202, as shown in FIG. 5B. Referring to FIG. 5C, metal balls 212 are positioned within the recesses 210 which are aligned with the holes 204 of the film 202 and not covered by the film 202. After the film 202 is removed from the mold 208, a second film 214 is applied to the mold 208 as shown in FIG. 6. The second film 214 has generally frustoconically shaped holes 216, however, other geometries may be used. The second film 214 with holes 216 pass therethrough. The holes 216 are narrower at the top than at the bottom of the second film. The holes 216 are aligned with all the recesses 210 of the mold 208, such that the metal balls 212 cannot be removed from the recesses 210, but access to all the recess 210 is available. The cavities defined by the holes 216 and recesses 210 are filled with solder 220 (for example, using injection molding) to form a metal filled solder contact. The second film 214 may be removed and the mold 208 flipped to position the metal filled solder contact comprising the solder 220 and the metal balls 212, onto a silicon wafer.

Figure 8A:
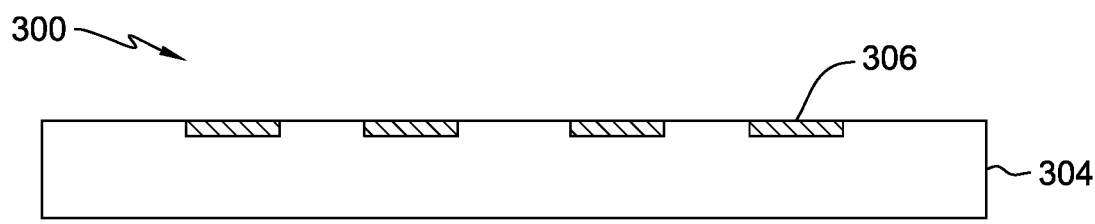
FIGS. 8A-8E are sequential schematic block diagrams illustrating a metal cored solder formation on a structure according to an embodiment of the invention.
Figure 8B:
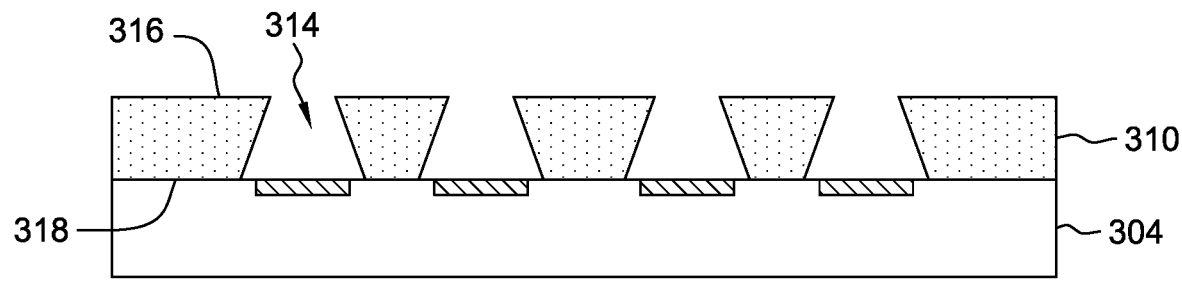

Referring to FIGS. 8A-8E, according to an illustrative embodiment of the present disclosure, a method 300 and system for processing metal cored solder contacts (bumps or structures) on an substrate embodied as a silicon wafer 304 having contact elements 306 on a top surface thereof, as shown in FIG. 8A. The contact elements may be of a Ball Limiting Metallurgy (BLM). A polymer film 310 is positioned over the silicon wafer 304. The film 310 includes apertures 314 therethrough. The apertures 314 are tapered from a top surface 316 of the film 310, to a bottom surface 318 of the film 130 which defines the apertures 314 having a generally frustoconical shape. In the embodiment of the invention shown in FIG. 8B, the film 310 has a narrower top portion of each of the apertures 314, and a wider bottom portion of each of the apertures 314, as defined by the geometry of the film 310, and shown in FIG. 8B. Instead of a decal, a dry film can be used and the dry film is pattered by using photolithography of laser drilling method to form FIG. 8B, as is shown in an embodiment in FIGS. 9A-9F.

Figure 8C:
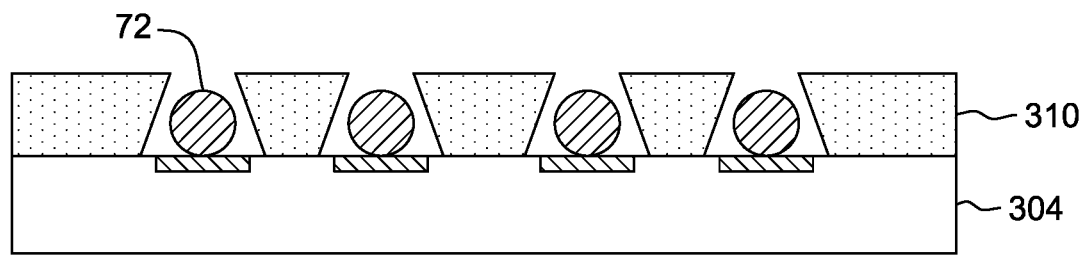
Figure 8D:
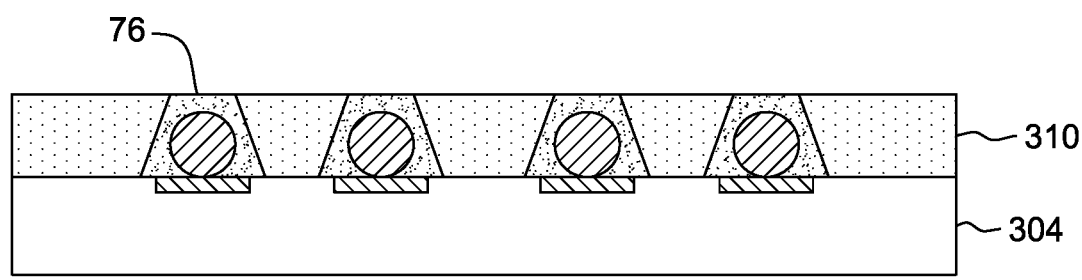
Figure 8E:
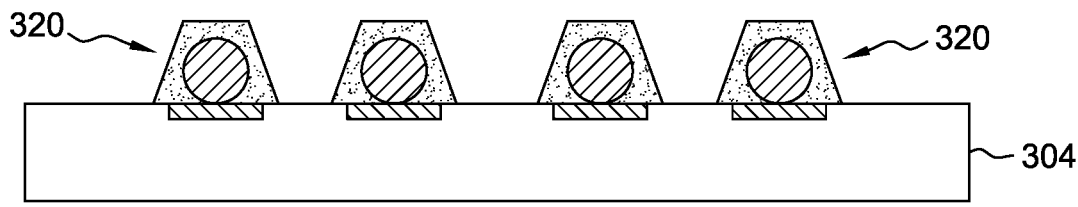

Referring to FIG. 8C, a metal ball 72 is positioned within the aperture 314 on the contact element 306 of the combined silicon wafer 304 and film 310. The aperture 314 is filled with molten solder 76 as shown in FIG. 8D. The solder may be injection molded. The molten solder 76 is cooled. The film 310 is removed from the silicon wafer 304 as shown in FIG. 8E. Metal core solder contacts 320 are comprised of the solder 76 surrounding the metal ball 72. In the case of using dry film, the dry film can be removed by using a solvent.

In an alternative embodiment, the same process 300 can be implemented using an organic substrate instead of a silicon wafer 304. In another embodiment, multiple films, for example, two films, can be stacked on one on top of the other, with aligning apertures to form a cavity on top of contact elements 306 of an organic substrate.

Figure 9A:
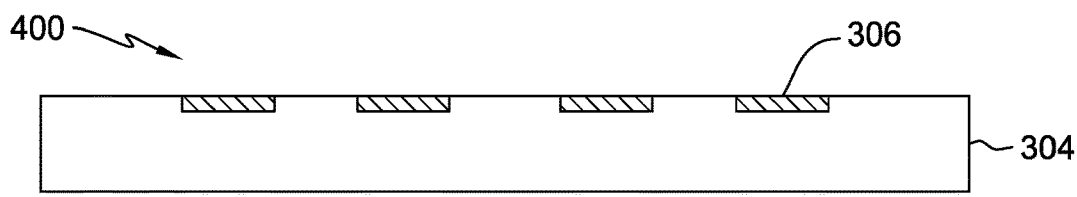
FIGS. 9A-9F are sequential block diagrams of a process for forming metal contacts using a dry film lamination according to an embodiment of the invention.
Figure 9B:
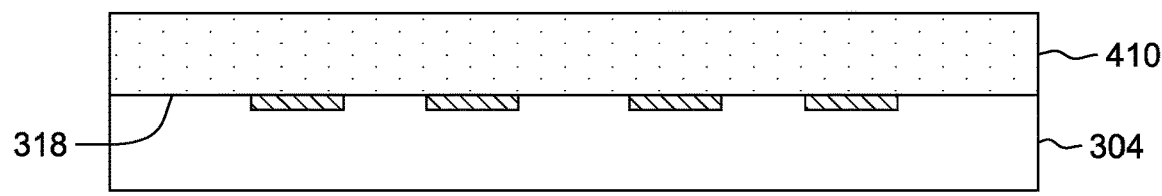
Figure 9C:
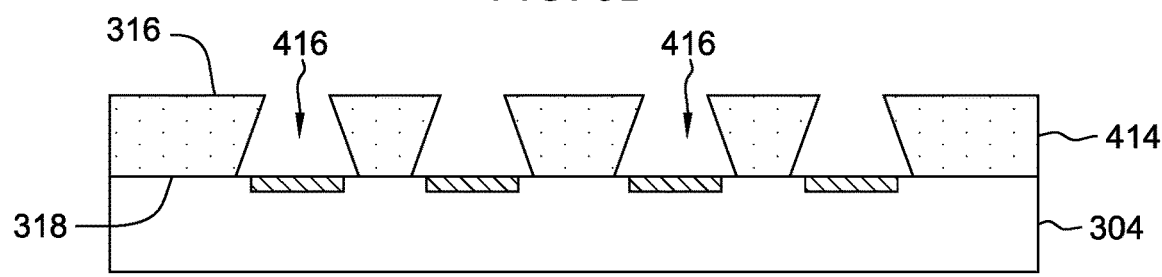

Referring to FIGS. 9A-9F, a method 400 and system according to another embodiment of the invention for processing solder contacts includes patterning a dry film on a substrate embodied as a silicon wafer 304 having contact elements 306. Each contact element 306 may be formed within the silicon wafer 304 and has an exposed top surface, as shown in FIGS. 9A-9E. Like elements of the embodiment of the invention shown in FIGS. 8A-8E have the same reference numerals. A dry film 410 is laminated on the silicon wafer 304 having contact elements 306, as shown in FIG. 9B. The film 410 is patterned to form a patterned film 414, for example, by photolithography or laser drilling. The patterned film 414 includes apertures 416 therethrough. The apertures 416 may be tapered as shown in FIG. 9C, or be non-tapered, or formed having other geometrical configurations.

Figure 9D:
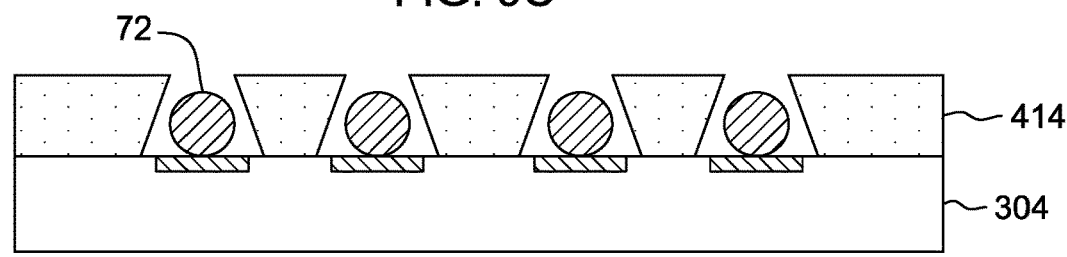
Figure 9E:
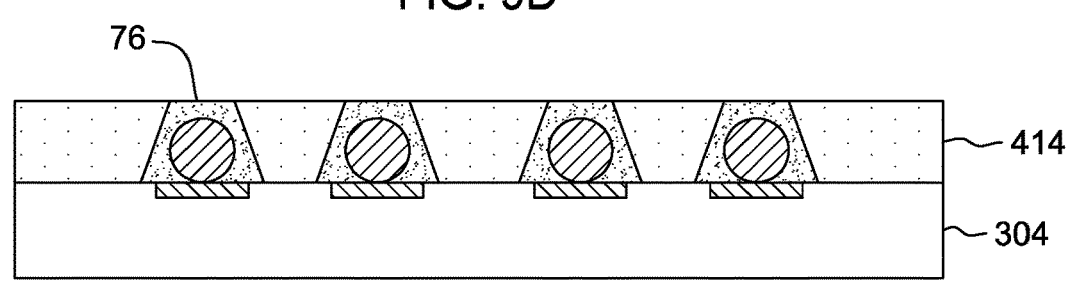
Figure 9F:
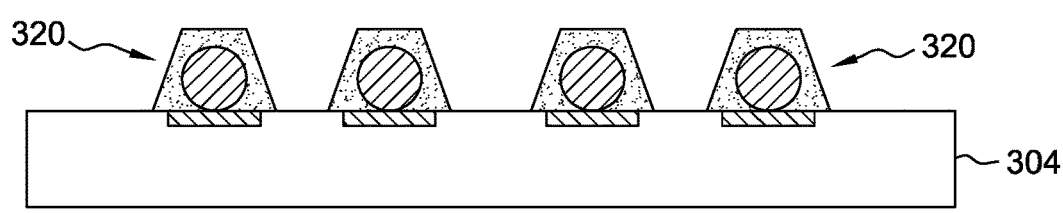

Referring to FIGS. 9D-9F, the process is similar to that shown in FIGS. 8C-8E. In FIG. 9F, the remaining dry film 410 may be removed by using a solvent.

What is claimed is:

1. A method of producing metal cored solder structures on a substrate, comprising:
   providing a decal having a plurality of apertures, the apertures being tapered from a top surface to a bottom surface of the decal;
   positioning a carrier beneath the bottom surface of the decal, the carrier having one or more cavities in a top surface and the cavities located in alignment with the apertures of the decal;
   positioning the decal on the carrier having the decal bottom surface in contact with the carrier top surface to form feature cavities defined by the decal apertures and the carrier cavities,
   receiving at each feature cavity a respective metal element therein, each feature cavity being configured to receive molten solder and being cooled in the feature cavity;
   separating the decal from the carrier to partially expose metal core solder contacts, the partially exposed metal core solder contacts extending below the bottom surface of said decal;
   combining the decal with the substrate by positioning the decal on the substrate, the substrate having receiving elements such that a bottom surface of each respective partially exposed metal core solder contact of the decal is positioned on a respective receiving element of the substrate;
   heating the combined decal and substrate to reflow the solder of the solder contacts within a respective receiving element; and
   removing the decal from holding the metal core solder contacts to thereby expose the metal core solder contacts on the substrate.

2. The method of claim 1, wherein each partially exposed metal core solder contacts includes one or more legs extending below a bottom surface of said decal.

3. The method of claim 1, wherein said metal element is a metal ball, said molten solder being wholly contained within the feature cavity and substantially surrounding said metal ball within the feature cavity.

* * * * *